US006850098B2

(12) United States Patent
Lee et al.

(10) Patent No.: US 6,850,098 B2
(45) Date of Patent: Feb. 1, 2005

(54) METHOD FOR NULLING CHARGE INJECTION IN SWITCHED NETWORKS

(75) Inventors: Wing Foon Lee, Singapore (SG); Pak Kwong Chan, Singapore (SG)

(73) Assignee: Nanyang Technological University, Singapore (SG)

( * ) Notice: Subject to any disclaimer, the term of this patent is extended or adjusted under 35 U.S.C. 154(b) by 0 days.

(21) Appl. No.: 09/916,224

(22) Filed: Jul. 27, 2001

(65) Prior Publication Data

US 2003/0020530 A1 Jan. 30, 2003

(51) Int. Cl.[7] .................................................. H03K 5/00

(52) U.S. Cl. .......................... 327/94; 327/91; 327/337; 327/362; 327/554

(58) Field of Search .......................... 327/91, 94, 170, 327/554, 555, 558, 336, 337, 362, 334

(56) References Cited

U.S. PATENT DOCUMENTS 5,479,121 A 12/1995 Shen et al. .................. 327/94
5,565,812 A * 10/1996 Soenen ...................... 327/558
5,614,854 A * 3/1997 Kuga ......................... 327/94
5,694,445 A * 12/1997 Hirano et al. ................ 377/57
5,698,999 A * 12/1997 Etoh et al. .................... 327/94
6,052,000 A * 4/2000 Nagaraj ....................... 327/94
6,163,287 A * 12/2000 Huang ........................ 341/143
6,404,262 B1 * 6/2002 Nagaraj et al. ............. 327/336

OTHER PUBLICATIONS

Je–Hurn Shieh, et al., "Measurement and Analysis of Charge Injection in MOS Analog Switches," *IEEE Journal of Solid–State Circuits*, vol. SC–22, No. 2, 4/87, pp. 277–281.

George Wegmann, et al. "Charge Injection in Analog MOS Switches," *IEEE Journal of Solid–State Circuits*, vol. SC–22, No. 6, 12/87, pp. 1091–1097.

Christoph Eichenberger, et al., "Dummy Transistor Compensation of Analog Switches," *IEEE Journal of Solid–State Circuits*, vol. 24, No. 4, 8/89, pp. 1143–1146.

Christoph Eichenberger, et al., "On Charge Injection in Analog MOS Switches and Dummy Switch Compensation Techniques," *IEEE Transactions on Circuits and Systems*, vol. 37, No. 2, 2/90, pp. 256–264.

* cited by examiner

*Primary Examiner*—Terry D. Cunningham
(74) *Attorney, Agent, or Firm*—Morrison&FoersterLLP

(57) ABSTRACT

A system and method to overcome or nullify a charge injection and clock feed-through error voltage caused by the turning-off charge of a switched element(s) in switched networks. A circuit for nulling a charge injection and clock feed-through error voltage includes, for example, two switched elements and a capacitor. The circuit can be used to replace any switch element in a switched network. The circuit may also include, for example, three switched elements and two capacitors.

4 Claims, 11 Drawing Sheets

Clocking Sequence Diagram

METHOD FOR NULLING CHARGE INJECTION IN SWITCHED NETWORKS

TECHNICAL FIELD OF INVENTION

The invention relates to electronic circuits in switched networks, and in particular, to a system and method to overcome charge injection and clock feed-through error voltage caused by the turning-off charge of switched elements in switched networks.

BACKGROUND OF THE INVENTION

A fundamental problem in switched networks is the "charge injection" problem when switched elements utilizing metal-oxide-semiconductor (MOS) in a circuit network are switched off. Such a problem is described in Je-Hurn, Shieh, Mahesh Patil, Bing J. Sheu, "Measurement and Analysis of Charge Injection in MOS Analog Switches", *IEEE Journal of Solid-State Circuits*, Vol. SC-22, No. 2, pp. 277–281, April 1987; George Wegmann, Eric A. Vittoz, Fouad Rahali, "Charge Injection in Analog MOS Switches". *IEEE Journal of Solid-State Circuits*, Vol SC-22, No. 6, pp. 1091–1097, December 1987. Redundant charges are injected into nodes, particularly for high impedance nodes, causing an erroneous voltage to appear at the circuit output. This erroneous voltage can be very large when amplified. These redundant charges typically result from two types of injection mechanisms. A first mechanism is caused by charges stored in MOS transistors when the channel is conducting (transistor is switched on). When switching off the transistor, the stored charges are forced to flow out of the channel, introducing redundant charges into the corresponding connecting nodes. A second mechanism, called a clock feed-through error, results from a clocking signal coupled to the connecting node via parasitic capacitors residing in the MOS transistor.

FIG. 1 illustrates a single N-channel enhancement mode MOS transistor (NMOS) switch in the prior art. In FIG. 1, an input signal to be switched is applied to the drain (D) terminal. The clock signal T is applied to the gate (G) terminal. The output signal is then available at the source (S) terminal when the switch is conducting (when clock T is high). In the following descriptions of switch configurations, the term "source" and "drain" are interchangeable, since the MOS transistor is a bilaterally symmetrical device. A terminal functions as a source or drain depending on the relative potential of the two terminals. If the N-channel transistor is formed in a N-substrate, a P-well is connected to the bulk terminal. Conversely, if the N-channel device is formed in a P-substrate, the P-substrate itself connects to the bulk. It is standard practice to connect all the P-wells in a N-substrate CMOS integrated circuit to the lowest voltage in the circuit. Hence, the bulk terminal will connect to ground or Vss. During the conduction of the NMOS switch, charges are stored in the conducting channel. When the switch is turned off (when clock T is low), the previously stored charges are forced to flow out to both sides of the source and drain terminals. The amount of charges injected depends on the impedance of each terminal. In addition, this single switch configuration is also subjected to clock feed-through error.

FIG. 2 shows a complementary MOS (CMOS) switch comprised of a NMOS having its source (S) and drain (D) connected in parallel to the source and drain of a P-channel MOS (PMOS) in the prior art. Clock signals T1 and T2, applied to the respective gate (G) terminals, are out of phase with each other. Hence, when the switch is on, both transistors will be conducting at the same time. The advantage of using a CMOS switch is that the effect of charge injection in a NMOS transistor is cancelled by the corresponding charge injection in a PMOS transistor when both devices turn off, provided the transistor is the same size. In practice, however, the net charge cancellation is difficult to achieve without additional clocking circuitry and a corresponding decrease in operating speed. If both transistors do not turn off at exactly the same time, the charge injected by the transistor turning off first will be swept through the transistor, which is still on, resulting in contribution of net charge injection. Furthermore, channel charge of a MOS device is a function of its threshold voltage as well as its size. It is well known that N-channel thresholds cannot be precisely the same absolute value as P-channel thresholds on a typical process. Hence, even the presence of opposite transition of clocking signals on a NMOS and a PMOS results in the parasitic capacitances on each transistor being different. Therefore, clock feed-through errors cannot be cancelled effectively.

A more effective method is to utilize dummy switches as illustrated in FIG. 3. Exemplary dummy switching techniques can be found in Christoph Erichenberger, Walter Guggenbuhl, "Dummy Transistor Compensation of Analog MOS Switches", *IEEE Journal of Solid-State Circuits*, Vol. 24, No. 4, pp. 1143–1145, August 1989; Christoph Erichenberger, Walter Guggenbuhl, "On Charge Injection in Analog MOS Switches and Dummy Switch Compensation Techniques", *IEEE Transactions on Circuits and Systems*, Vol. 37, No. 2, pp. 256–264, February 1990. The overall switch element consists of a main transistor switch (MM) and a dummy transistor switch (MD). The size of the dummy transistor switch is about half of the main transistor switch. The drain (D) and the source (S) terminals of the dummy transistor are shorted together and in turn connected to the source (S) of main transistor. The drain of the main transistor will form the other signal terminal of the switch element. Clock signals T1 and T2, applied to the respective gate (G) terminals, are out of phase with each other. Hence, only one transistor is switched on at a time. The terminal where the dummy transistor resided will connect to the high impedance node of the circuit where the charge injection problem will occur, while the other signal terminal will connect to the low impedance node. When the main transistor is turned off, the dummy transistor is turned on, hence the previously stored charges in the main transistor switch are absorbed by the turning on of the dummy transistor. The "half-sized" dummy transistor technique assumed that half of the stored charges would be forced out on both sides of signal terminals from the main transistor. In practice, if the terminal impedances are unbalanced, the charge distribution will not be equal, resulting in some charges injected to the high impedance node. In addition, clock feed-through error will still prevail since the parasitic capacitances of the main and dummy transistors are different. Furthermore, matching the main and dummy transistors is not as good as matching two same-sized transistors.

FIG. 4 shows a schematic diagram of a charge injection compensating circuit in the prior art. Wei-Chen Shen, Yen-Bin Gu, Chu-Chang Lin, Min-Jer Chen, Po-Chin Hsu, Tien-Yu Wu, "Compensating Circuit for MOSFET Analog Switches", U.S. Pat. No. 5,479,121, Dec. 26, 1995 describes such a circuit. The circuit comprises a NMOS transistor switch M2 being connected in parallel to a capacitor C3. The drain of M2 is connected to capacitor C1, which is in series with C2. The source of M2 is connected to the other terminal of C2 which is connected to the gates of the CMOS inverting amplifier M3 and M4 at node B. The output of the CMOS inverting amplifier is connected back to the drain of M2. The gate of M2 is connected to the switching clock together with the gate of the main NMOS transistor switch M1, whose drain is connected to the incoming signal. The source of M1 will form a node in between C1 and C2 at node A. Capacitors C1, C2 and C3 each have a capacitance of at least 0.2 pF, and the inverting amplifier has a gain of at least 30 dB. Since the gain of the CMOS inverting amplifier is significantly greater, the parasitic capacitance has no effect on the error compensating characteristics of the compensating circuit. In operation, the node A is connected at the point in the circuit being compensated where the turn off charge causing the error is injected. There is a turn off charge from M2, Q2, injected into node B and another turn off charge from M1, Q1, into node A. The voltage at node A due to these charges is proportional to Q2 multiplied by the capacitance C1 subtracted from Q1 multiplied by the capacitance C3. By properly choosing the values of C1 and C3, the voltage at the node A due to turn off charges can be made zero or nearly zero. Often Q1 and Q2 are equal so that C1 and C3 are chosen to be equal. However, this compensation circuit still suffers from clock feed-through error because the clocking of the main and compensation switches are coming from the clock. Moreover, as the compensation circuit consists of many components and an amplifier, it will occupy much larger area and higher power consumption as compared to the previous three prior arts.

SUMMARY OF THE INVENTION

In one embodiment of the invention, there is a circuit that includes, for example, a first switching element coupled to a first terminal and a second terminal, a second switching element coupled to the first terminal and a capacitor coupled between the second switching element and a ground or reference voltage.

In one aspect of the invention, there is a first clock signal to switch the first switching element between high and low and a second clock signal to switch the second switching element between high and low.

In another aspect of the invention, the first terminal is a high impedance node, the second terminal is a low impedance node, and the circuit operates to substantially null and cancel the charge injection and clock feed-through error voltage, by absorbing the charge injection into the capacitor, and by generating a compensation signal with opposite polarity, respectively.

In still another aspect of the invention, the circuit replaces a switching element in a switched network.

In another embodiment of the invention, there is a switching element that includes, for example, a circuit including a first switching element coupled to a first terminal and a second terminal, a second switching element coupled to the first terminal, and a capacitor coupled between the second switching element and a ground or reference voltage.

In one aspect of the invention, the circuit substantially nulls a charge injection by absorbing the charge injection into the capacitor and canceling the clock feed-through error voltage by generating a compensation signal with opposite polarity at the first terminal.

In another aspect of the invention, the circuit replaces another switching element in the switched network.

In still another aspect of the invention, the another switching element is at a location in the switched network where a charge injection or a clock feed-through error voltage is high.

In still another embodiment of the invention, there is a method of nulling a charge injection and a clock feed-through error voltage in a switched network. The method includes, for example, replacing at least one switching element in the switched network with a nulling circuit, the nulling circuit nulling the charge injection by absorbing the charge injection into a capacitor.

In one aspect of the invention, the method further includes generating a compensation signal such that the clock feed-through error voltage has been removed.

In yet another embodiment of the invention, there is a method of nulling a charge. The method includes, for example, switching a first switching element to off by turning a first clock signal to low, injecting a clock feed-through error voltage and a charge injection into a first terminal, and switching a second switching element to on by turning a second clock signal to high, canceling the clock feed-through error voltage and nulling the charge injection as a result of the opposite signal polarities and absorbing the charge injection into a capacitor, respectively.

In another embodiment of the invention, there is a method of nulling a charge injection in a switched network. The method includes, for example, injecting a node with a stored channel charge and clock feed-through voltage, and nulling the charge and voltage injected into the node by absorbing the charge in a capacitor and removing the clock feed-through error voltage by generating a compensation signal with opposite polarity.

In one aspect of the invention, the injecting occurs as a result of providing a first clock signal to a first switch such that the first switch is turned off, and the nulling occurs as a result of providing a second clock signal to a second switch such that the second switch is turned on, resulting in the compensation signal.

In one embodiment of the invention, there is a circuit that includes, for example, a first switching element coupled to a first node and a second node, a second switching element coupled to the first node, a third switching element coupled to the second node, and a first capacitor coupled between the second switching element and a ground or reference voltage, and a second capacitor coupled between the third switching element and a ground or reference voltage.

In one aspect of the invention, there is a first clock signal to switch the first switching element between high and low and a second clock signal to switch the second and third switching elements between high and low.

In another aspect of the invention, the first node is a high impedance node, the second node is a high impedance node, and the circuit operates to substantially null and cancel the charge injection and clock feed-through error voltage, by absorbing the charge injection into the first and second capacitors, and by generating a compensation signal with opposite polarity at the first and second nodes, respectively.

In still another aspect of the invention, the circuit replaces a switching element in a switched network.

In another embodiment of the invention, there is a switching element. The switching element includes, for example, a circuit including a first switching element coupled to a first node and a second node, a second switching element coupled to the first node, a third switching element coupled to the second node, and a first capacitor coupled between the second switching element and a ground or reference voltage, and a second capacitor coupled between the third switching element and a ground or reference voltage.

In one aspect of the invention, the circuit substantially nulls a charge injection by absorbing the charge injection into the first and second capacitors and canceling the clock feed-through error voltage by generating a compensation signal with opposite polarity at the first and second nodes.

In another aspect of the invention, the circuit replaces another switching element in the switched network.

In still another aspect of the invention, the another switching element is at a location in the switched network where a charge injection or a clock feed-through error voltage is high.

In still another embodiment of the invention, there is a method of nulling a charge injection and a clock feed-through error voltage in a switched network. The method includes, for example, replacing at least one switching element in the switched network with a nulling circuit, the nulling circuit nulling the charge injection by absorbing the charge injection into a first capacitor and a second capacitor.

In one aspect of the invention, the method further includes generating a compensation signal at a first node and a second node such that the clock feed-through error voltage has been removed.

In yet another embodiment of the invention, there is a method of nulling a charge. The method includes, for example, switching a first switching element to off by turning a first clock signal to low, injecting a clock feed-through error voltage and a charge injection into a first node and a second node, and switching a second switching element and a third switching element to on by turning a second clock signal to high, canceling the clock feed-through error voltage and nulling the charge injection as a result of the opposite signal polarities and absorbing the charge injection into a second capacitor and a third capacitor, respectively.

In another embodiment of the invention, there is a method of nulling a charge injection in a switched network. The method includes, for example, injecting a first node and a second node with a stored channel charge and clock feed-through voltage, and nulling the charge and voltage injected into the first and second nodes by absorbing the charge in a first capacitor and second capacitor and removing the clock feed-through error voltage by generating a compensation signal with opposite polarity at the first and second nodes.

In one aspect of the invention, the injecting occurs as a result of providing a first clock signal to a first switch such that the first switch is turned off, and the nulling occurs as a result of providing a second clock signal to a second switch and a third switch such that the second and third switches are turned on, resulting in the compensation signals.

DETAILED DESCRIPTION OF THE INVENTION

Figure 1:
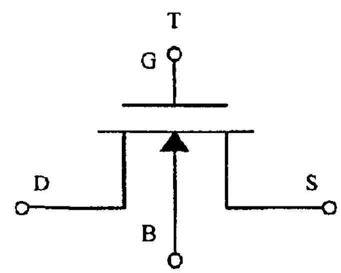
FIG. 1 illustrates a single N-channel enhancement mode MOS transistor (NMOS) switch in the prior art.
Figure 2:
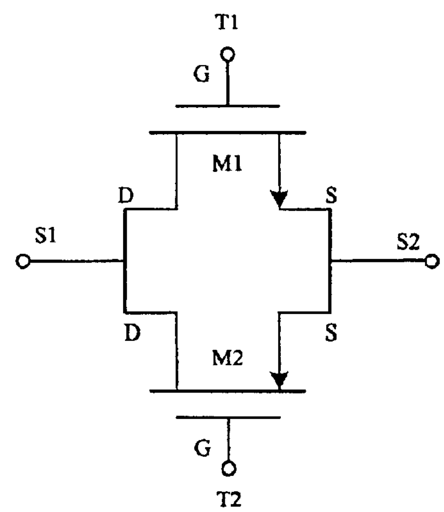
FIG. 2 shows a complementary MOS (CMOS) switch comprised of an NMOS having a source and drain connected in parallel to the source and drain of a P-channel MOS (PMOS) in the prior art.
Figure 3:
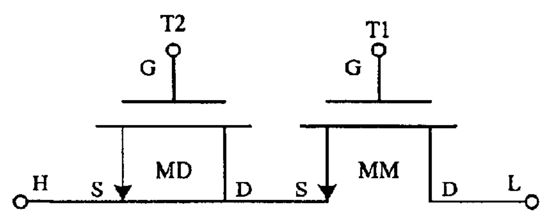
FIG. 3 illustrates a dummy switch in the prior art.
Figure 4:
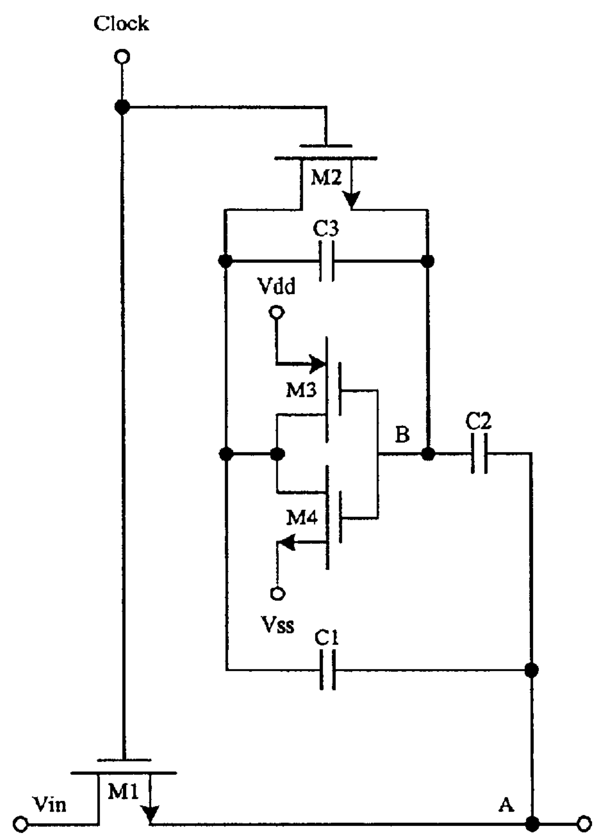
FIG. 4 shows a schematic diagram of a charge injection compensating circuit in the prior art.
Figure 5:
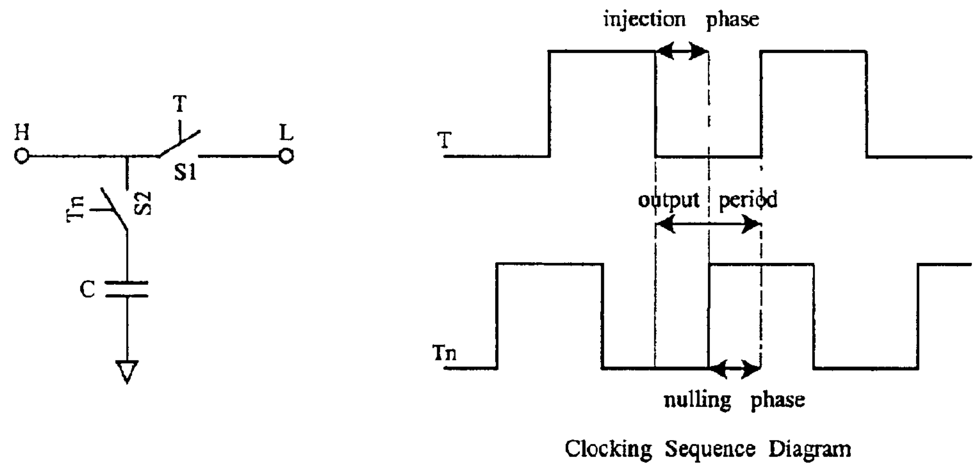
FIG. 5 illustrates an exemplary injection nulling switch of the present invention.

FIG. 5 illustrates an exemplary injection nulling switch of the present invention. Two switched elements, S1 and S2, are connected together at terminal H. The other terminal of switched element S2 is connected to a capacitor C, which is connected to ground or a reference voltage. The clock signals T and Tn switching the element S1 and S2, respectively, are shown in the clocking sequence diagram of FIG. 5. Terminal H is connected to the high impedance node and has a charge injection and clock feed-through error, while terminal L is connected to the low impedance node. The switched elements can be of any MOS switches described, for example, in the prior art. However, the simplest configuration is to use a single NMOS transistor for the switched element S1 and S2. The size of the switched elements can be of minimum size and the value of the capacitor C can be around 1 pF.

Operation of the circuit is based on two phases, the injection phase and the nulling phase. At the start of the injection phase, switched element S1 is turned off (T is low), resulting in a clock feed-through error, and previously stored channel charges are injected into high impedance node at terminal H. The redundant charges injected by switched element S1 are allowed to settle during the injection phase. The settling of injected charges is important in the completion of the nulling of these redundant charges during the nulling phase. On entering the nulling phase, the switched element S2 is turned on (Tn is high). This turning-on action of S2 (clock from low to high) generates a compensation signal with opposite polarity that nulls the clock feed-through error caused by turning-off of S1 (clock from high to low) as both the clocking signals are of opposite polarity. The nulling switch can achieve a complete nulling of the clock feed-through error since the parasitic capacitances of the switches are the same. The previously stored channel charges injected into the high impedance node are also absorbed by the capacitor C when S2 is switched-on. At the end of the nulling phase, a sampled output is taken, which is free of clock feed-through error voltage and the injection of channel charges. The subsequent turning-off action in switch element S2 will not create any charge injection since switched element S1 is already turned on at that time. The clock feed-through error and charges injected by switched element S2 is absorbed by the low impedance node at terminal L.

Figure 6:
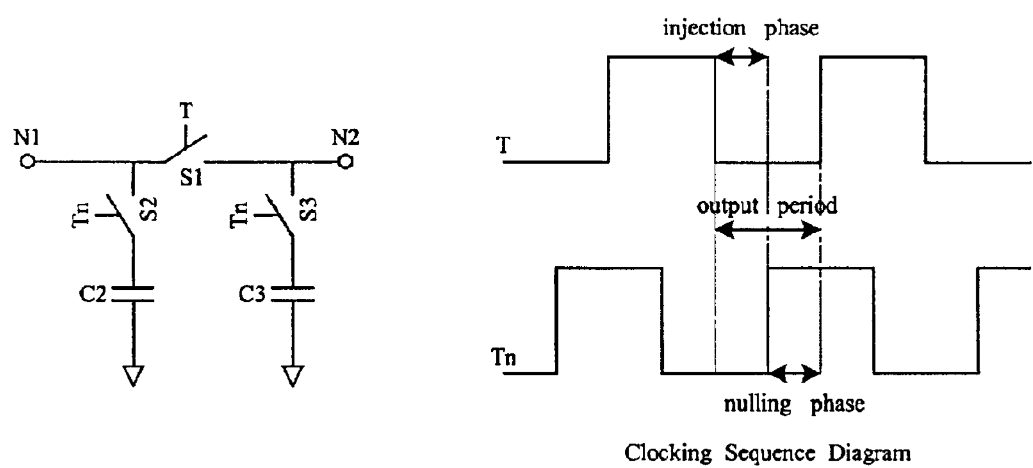
FIG. 6 illustrates an exemplary injection nulling switch of the present invention using three switches and two capacitors.

The invention can also be extended to the topology of a switch element (or circuit or method) having the nulling capabilities on both sides of the main switch element S1 which is connected to node N1 and node N2, as illustrated in FIG. 6. On both sides of the main switch element S1, there are two nulling branches, with each comprising of a switched element (S2 and S3) being connected to the respective capacitor (C2 or C3). FIG. 6 illustrates an exemplary injection nulling switch of the present invention as an alternative to FIG. 5 if both sides of a switch suffer from charge injection and/or clock feed-through problems. A switched element S1 is connected between a first node N1 and second node N2. A second switched element S2 is connected to N1 and to a capacitor C2, which is in turn connected to ground or a reference voltage. A third switched element, S3, is connected to N2 and to a capacitor C3, which is in turn connected to ground or a reference voltage. The clock signals T switching the switched element Si and Tn switching the switched elements S2 and S3, are shown in the clocking sequence diagram of FIG. 6. Node N1 and node N2 is connected to the high impedance node that has a charge injection and/or clock feed-through error. The switched elements can be of any MOS switches described, for example, in the prior art. However, the simplest configuration is to use a single NMOS transistor for the switched elements S1, S2 and S3. The size of the switched elements can be of minimum size and the value of the capacitors C2 and C3 can be around 1 pF. The operation is similar to the circuit in FIG. 5 except that the nulling of charge injection and cancellation of clock feed-through error take effect on both side of the switched element S1, which is at node N1 and N2.

The injection-nulling switch of the present invention has very wide applications. It can be applied to any switched network by replacing any switch element in the switched network, particularly in critical areas where charge injection and/or clock feed-through problems are of concern. The injection-nulling switch is considered a switch to improve the conventional techniques described above from five to an order and above. It is particularly useful for high-precision applications in low-cost implementation, and achieves a variety of important results.

The following will illustrate the application of injection-nulling switch (FIG. 5) to an exemplary number of switched networks. To show the effectiveness of the injection-nulling switch, the same circuit is simulated with an ideal switch and a dummy switch, which is described in the prior art. The ideal switch is modeled as a voltage dependent resistor having an on-resistance of $1\times10^{-3}$ ohms and an off-resistance of $1\times10^{15}$ ohms. The results are plotted on the same curve for comparison. For purposes of the examples, the circuits described herein are operated in a single 5V supply and have their analog ground connected to 2.5V reference. For simplicity in explanation, the term "redundant charges" will mean both the previously stored channel charges injection and clock feed-through error.

Figure 7A:
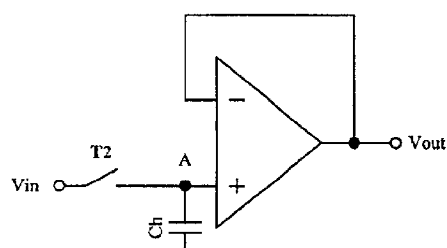
FIG. 7*a* shows a sample-and-hold circuit using an ideal switch.
Figure 7B:
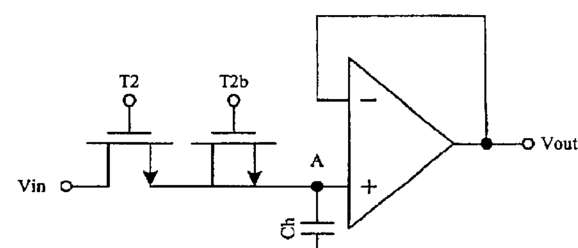
FIG. 7*b* shows a sample-and-hold circuit using an dummy switch.
Figure 7C:
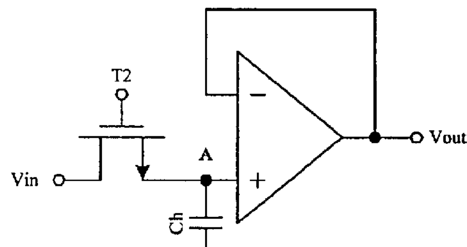
FIG. 7*c* shows a sample-and-hold circuit using a single NMOS switch.
Figure 7D:
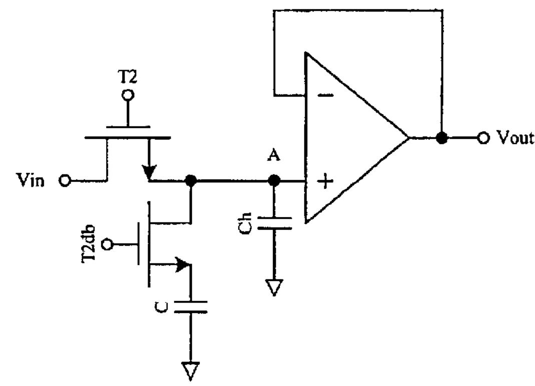
FIG. 7*d* shows a sample-and-hold circuit using the exemplary injection-nulling switch of the present invention which describes the first embodiment.
Figure 8:
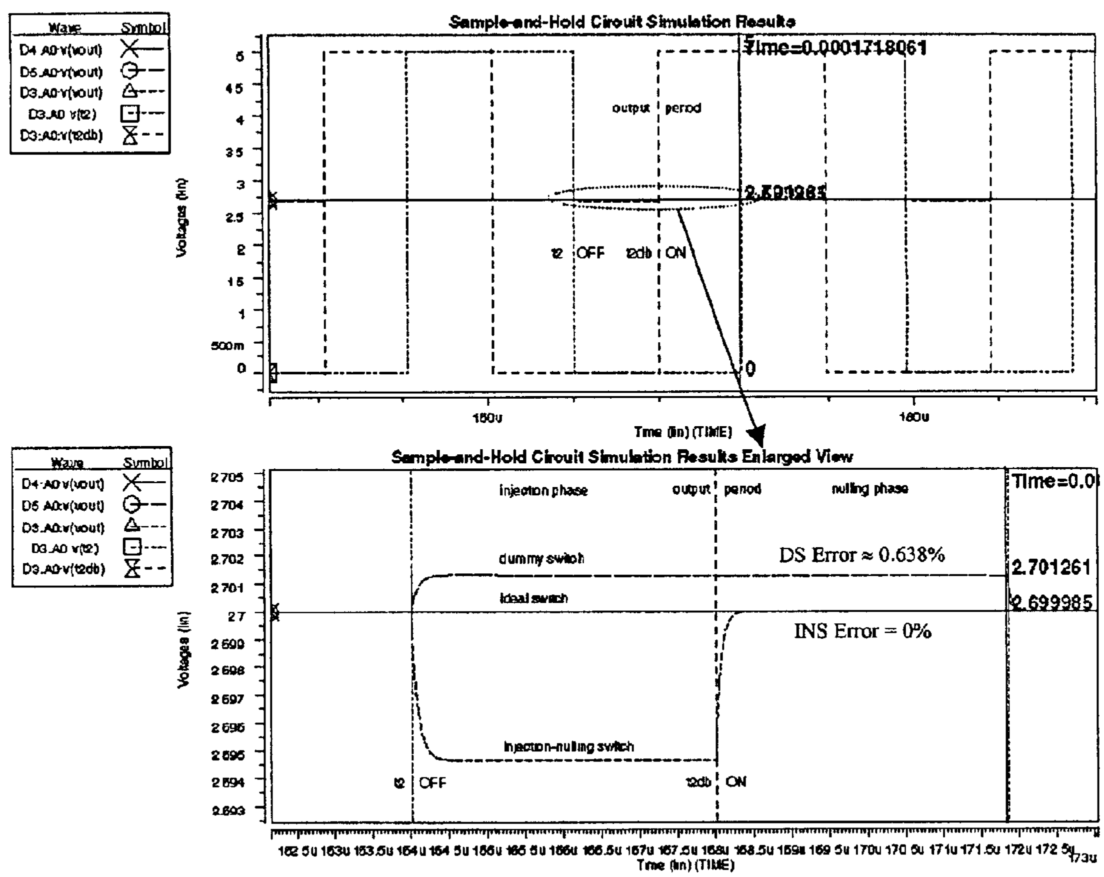
FIG. 8 illustrates simulation results of the exemplary circuit.

FIG. 7*a* shows a conventional open-loop sample-and-hold circuit. This circuit is often used to demonstrate problems associated with charge injections and to compare the effectiveness of the charge injection compensation circuits. The circuit comprises a sampling switch, a holding capacitor and a buffer. The sampling switch samples the input signal and stores its value in the holding capacitor during the sampling period when the switch is closed. The actual output is taken from the buffer at the end of the holding period when the switch is turned off. Hence, error voltage would appear during the output period as the turning-off switch injects redundant charges into the high impedance node of the buffer. To compare the compensation effectiveness of the injection-nulling switch, three circuits are simulated with input signals set to 2.7V, a holding capacitor of about 1 pF and a sampling switch using an ideal switch (FIG. 7*a*), a dummy switch (FIG. 7*b*) and the exemplary injection-nulling switch (FIG. 7*d*) of the present invention which describes the first embodiment. The terminal H in the dummy switch or in the injection-nulling switch is connected to the high impedance node of the circuit, which is the input of the buffer. Terminal L, on the other hand, is connected to the input signal. Each of the switch elements (S1 and S2) for the injection-nulling switch is implemented using a single NMOS. The clocks T and Tn, as illustrated in FIG. 5, are performed by T2 and T2db (FIG. 7*d*) in the circuit, respectively. One end of the capacitor C (value of about 1 pF) that is connected to a reference voltage is tied to the analog ground. These connections are maintained for each of the embodiments described below, and are used for exemplary purposes. FIG. 8 illustrates the simulation results of the three described circuits. It can be seen that during the nulling phase (T2db on), the redundant charges injected previously by turning off the switch S1 (T2 off) are nulled by the action of turning on the switch S2 (T2db on) and absorbing them into the capacitor (comparing the curve of the ideal switch). As for the dummy switch, the charge injection remains. The inaccuracy (15 nV) of the output is caused by the offset of the buffer. The percentage error caused by the switches are indicated in the plots by 'DS Error' and 'INS Error' where 'DS Error' means percentage error caused by the dummy switch and 'INS Error' indicates the percentage error due to injection-nulling switch.

The sample-and-hold circuit is also implemented using discrete components to demonstrate the effectiveness of the injection-nulling switch experimentally. The discrete-type switches are implemented, in the preferred embodiment, using for example a "quad analog switch with level translator", the holding capacitance Ch and the capacitance of the injection-nulling switch capacitor C is set to 220 pF (FIG. 7*d*) and the input voltage is set to 3.5V. Since there is no half-sized analog switch in the "quad analog switch with level translator", the experimental results are compared between the circuit using a single NMOS switch (FIG. 7*c*) and the circuit using the injection-nulling switch (FIG. 7*d*).

Figure 9:
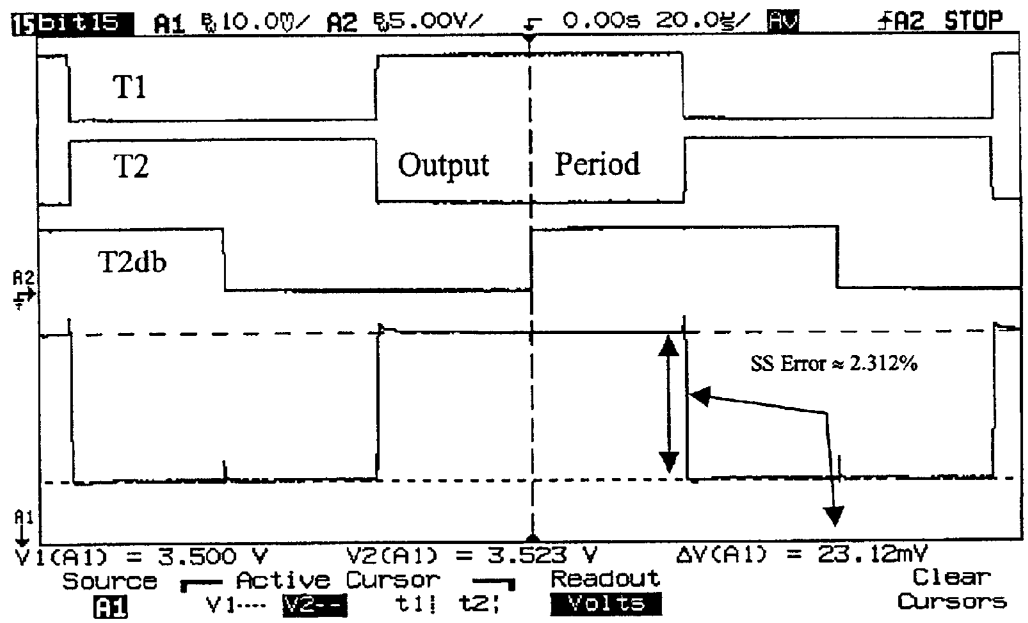
FIG. 9 shows experimental results of sample-and-hold circuit using single NMOS switch.
Figure 10:
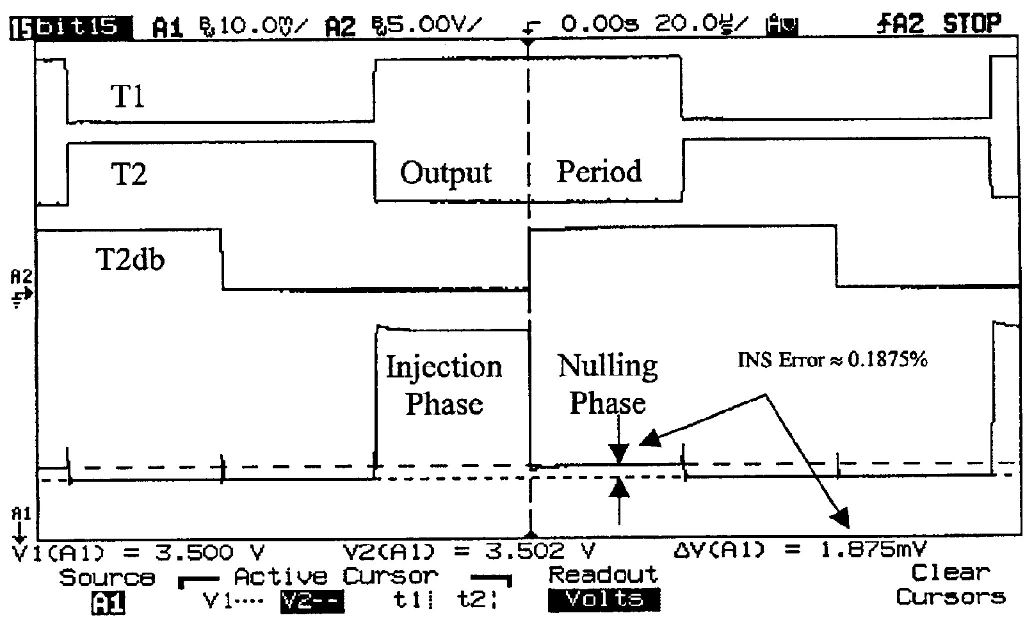
FIG. 10 shows experimental results of sample-and-hold circuit using the exemplary circuit (injection-nulling switch).

The experimental result for a single NMOS switch is shown in FIG. 9, while an injection-nulling switch is shown in FIG. 10. The results are captured using, for example, a mixed-signal oscilloscope, which enables the error voltage to be amplified onto the screen. From FIG. 9, it can be seen that the circuit using a single NMOS switch has a charge injection error voltage of about 23.12 mV, while from FIG. 10, the injection error voltage due to the injection-nulling switch is only about 1.875 mV (during the nulling phase). The percentage error caused by the single switch is indicated by 'SS Error'. Hence, it is demonstrated that the injection-nulling switch solves the charge injection problem very effectively. The results in FIG. 9 and FIG. 10 show not only the clocking sequence of T2 and T2db, they also indicate the T1 clock sequence (non-overlapping of T2) that will be used to describe the operation of the following circuits.

Figure 11:
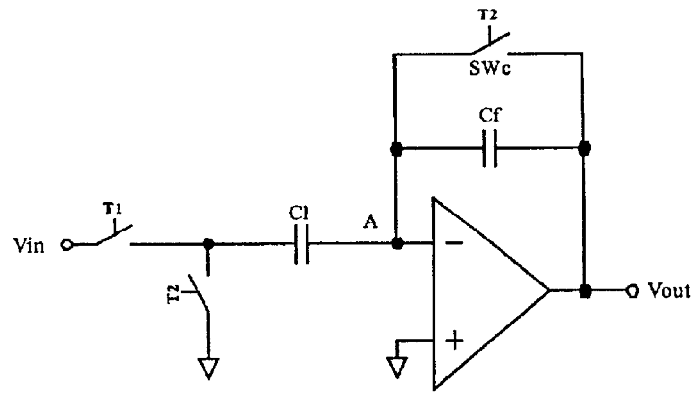
FIG. 11 shows a schematic diagram of simple switched-capacitor gain circuit.

FIG. 11 shows a simple switched-capacitor gain stage. The voltage across the feedback capacitor, Cf, is reset on each T2. While on T1, the output voltage charges Cf to balance the charging current flowing across C1 at the same time. At the end of T1, the output voltage is related to the input voltage by $$Vout = -\frac{C1}{Cf} Vin \tag{1}$$

Figure 12:
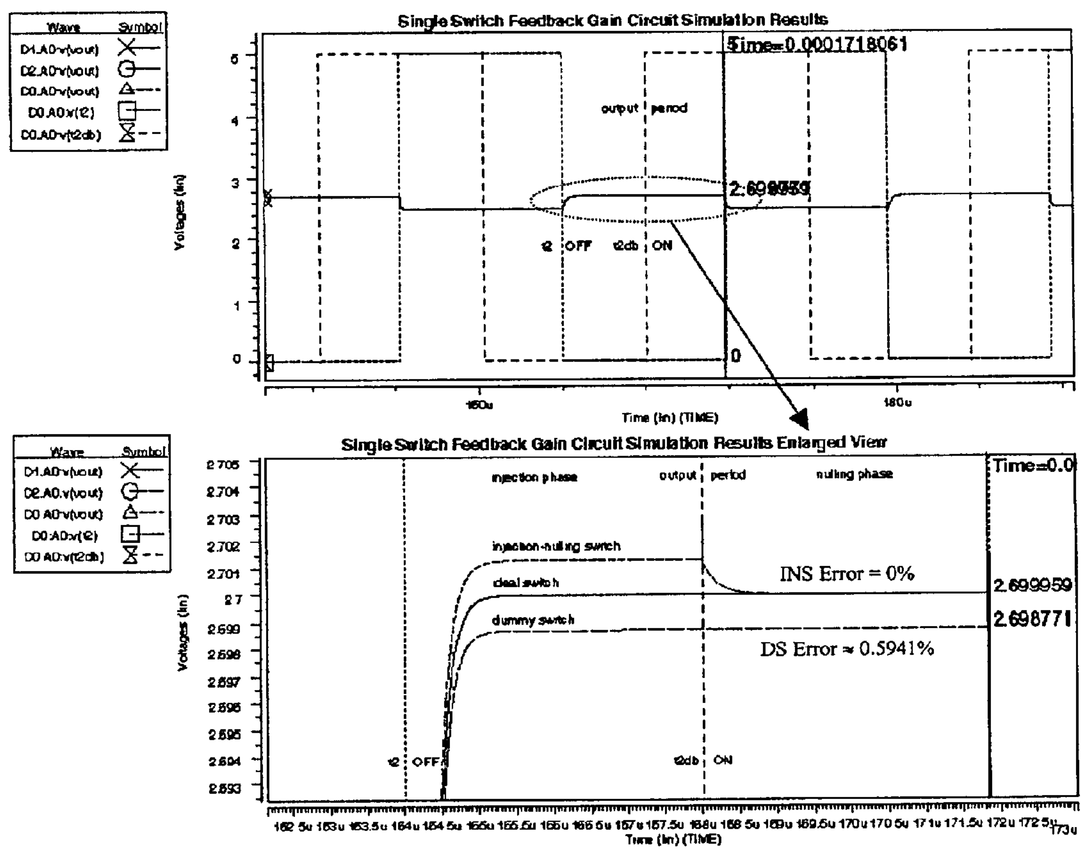
FIG. 12 illustrates simulation results of simple switched-capacitor gain circuit.

To simulate this circuit, C1 and Cf values are set to about 1 pF. A simple two-stage opamp is used (this two-stage opamp is used in the various circuits throughout this document except for the fully differential opamp configuration, and are merely exemplary) and Vin is set to 2.3V. Hence, the ideal output voltage will be 2.7V with analog ground at 2.5V. Switches are implemented using CMOS switches, in the preferred embodiment, except the critical switch (SWc) connected between node A and Vout. The comparison is performed with the critical switch (SWc) replaced by the ideal switch, a dummy switch (terminal H connected to node A, terminal L connected to Vout), and an injection-nulling switch (terminal H connected to node A, terminal L connected to Vout) forming three different circuits. The simulation results of the three circuits are plotted as illustrated in FIG. 12. During the nulling phase, the output voltage of the circuit using the injection-nulling switch is equal to the output voltage of the circuit using the ideal switch and is free of redundant charge injection. The inaccuracy is due to the ineffective offset cancellation and the finite gain error of the opamp. Using an INS is far more effective than using a dummy switch and is comparable to an ideal switch.

Figure 13:
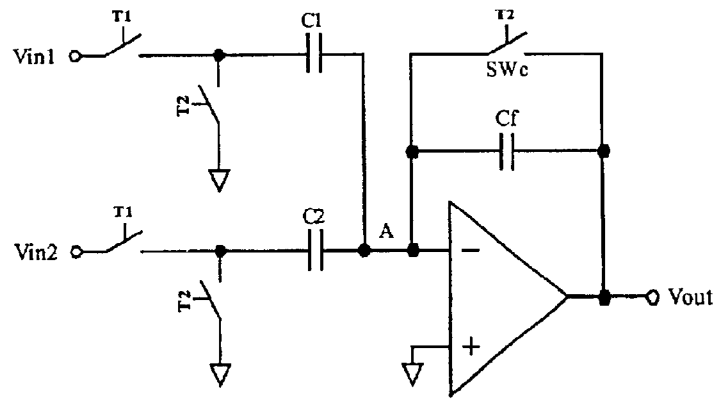
FIG. 13 shows a schematic diagram of summing circuit.

FIG. 13 shows a switched-capacitor summing circuit. Similar to the above gain stage, the critical switch (SWc) between node A and Vout clears the charge of the feedback capacitor Cf on each T2. At the end of T1, the output voltage will be the sum of the input voltages as a ratio given as $$Vout = -\left[\frac{C1}{Cf} Vin1 + \frac{C2}{Cf} Vin2\right] \tag{2}$$

Figure 14:
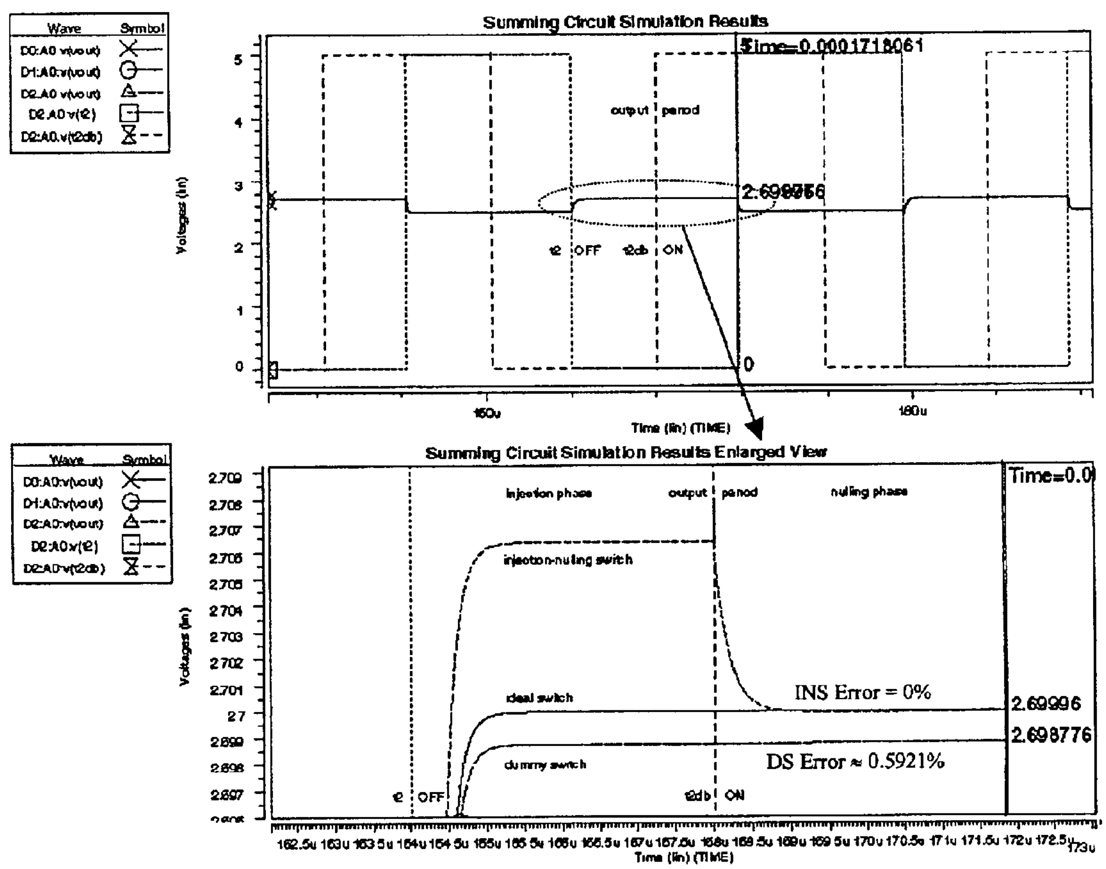
FIG. 14 shows simulation results of summing circuit.

FIG. 14 shows the results of three different circuits with the critical switch (SWc) replaced by an ideal, a dummy and an injection-nulling switch. In this example, C1 and Cf equal 1 pF, C2 equals 40 fF, Vin1 equals 2.4V and Vin2 equals 0V. All other switches are implemented using a CMOS switch. Hence, the output voltage is 2.7V having an analog ground at 2.5V. Operation of the circuit at these levels demonstrates that the injection-nulling switch effectively nulls the redundant charges injected to the high impedance node A; and the output voltage of the circuit using the injection-nulling switch is exactly equal to that of the ideal switch during the nulling phase.

Figure 15:
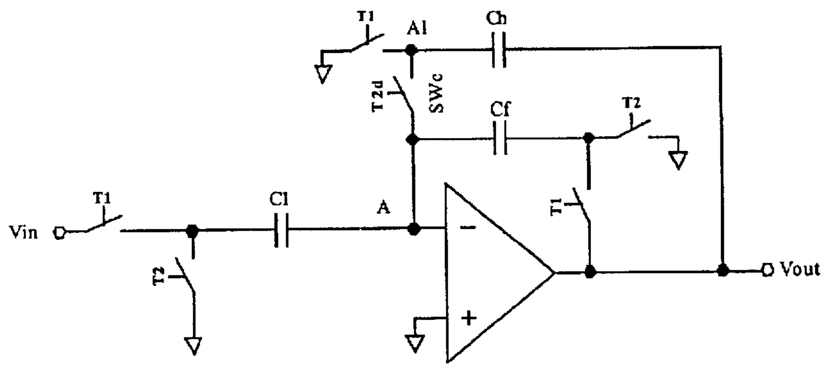
FIG. 15 shows a schematic diagram of capacitive-reset gain circuit.
Figure 16:
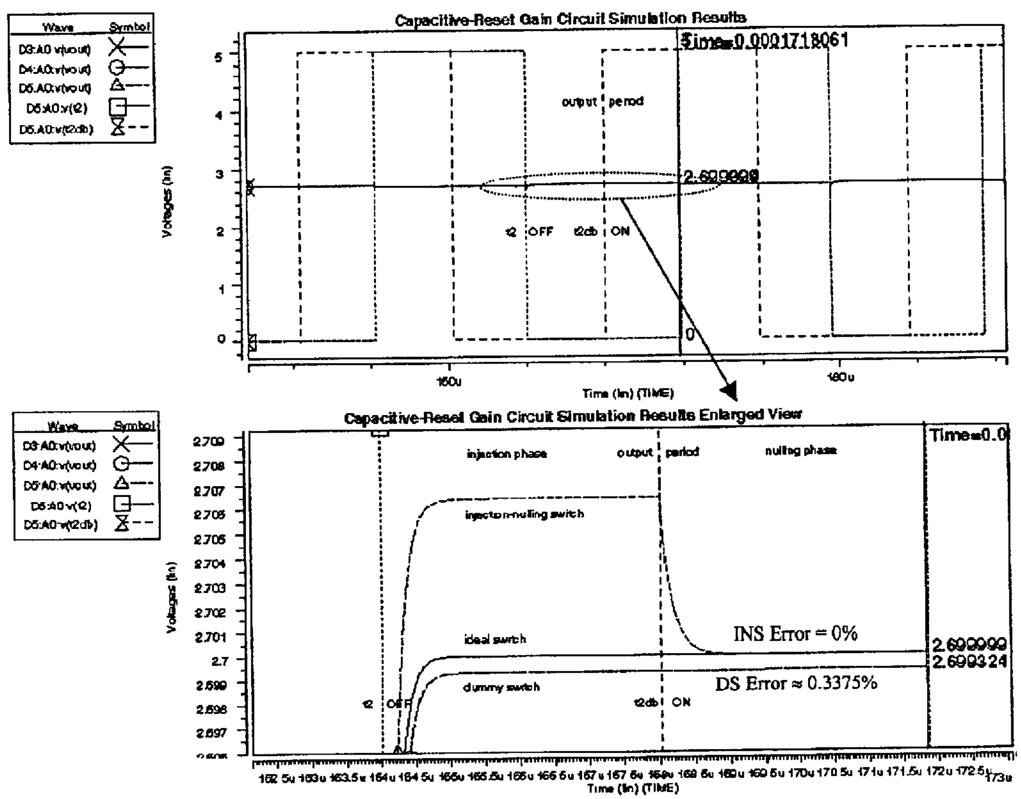
FIG. 16 illustrates simulation results of capacitive-reset gain circuit.

The capacitive-reset gain circuit is shown in FIG. 15. The output of this circuit will be more accurate compared to the circuit in FIG. 11 because it improves the offset and finite gain error of the opamp and relaxes the slew-rate of the opamp by adding the holding capacitor Ch. With the same conditions as those used in FIG. 11 and Ch set to 1 pF, the ideal output voltage will be 2.7V. The critical switch (SWc) connected between node A and node A1 is simulated with an ideal, a dummy and an injection-nulling switch. The results of operating the circuit are plotted in FIG. 16. Additional results to the actual output voltage can be seen in the circuit with an ideal switch and an injection-nulling switch during the nulling phase.

Figure 17:
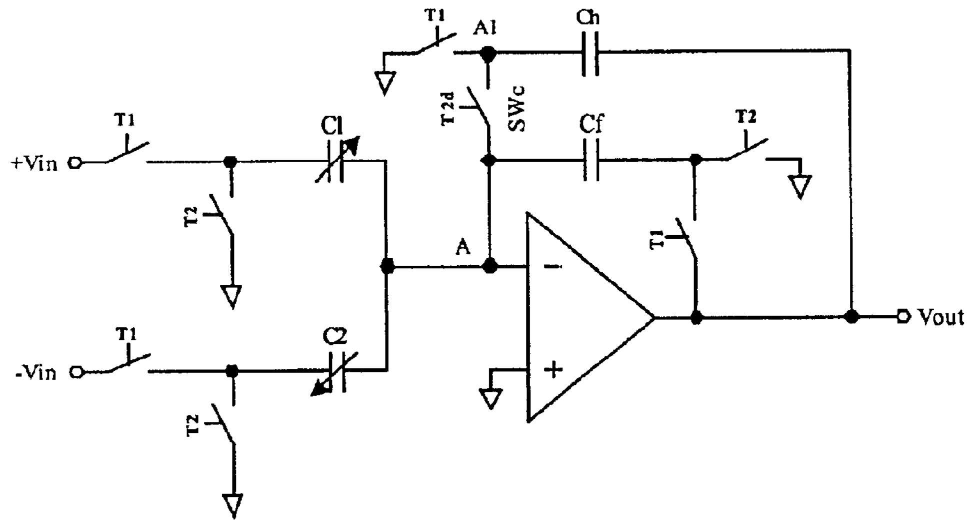
FIG. 17 shows a schematic diagram of accelerometer sensing amplifier utilizing the capacitive-reset gain circuit of FIG. 15.

FIG. 17 shows an accelerometer sensing amplifier utilizing the capacitive-reset gain circuit of FIG. 15. The output voltage is determined by $$Vout = -\left(\frac{C1 - C2}{Cf}\right) Vin \tag{3}$$

Figure 18:
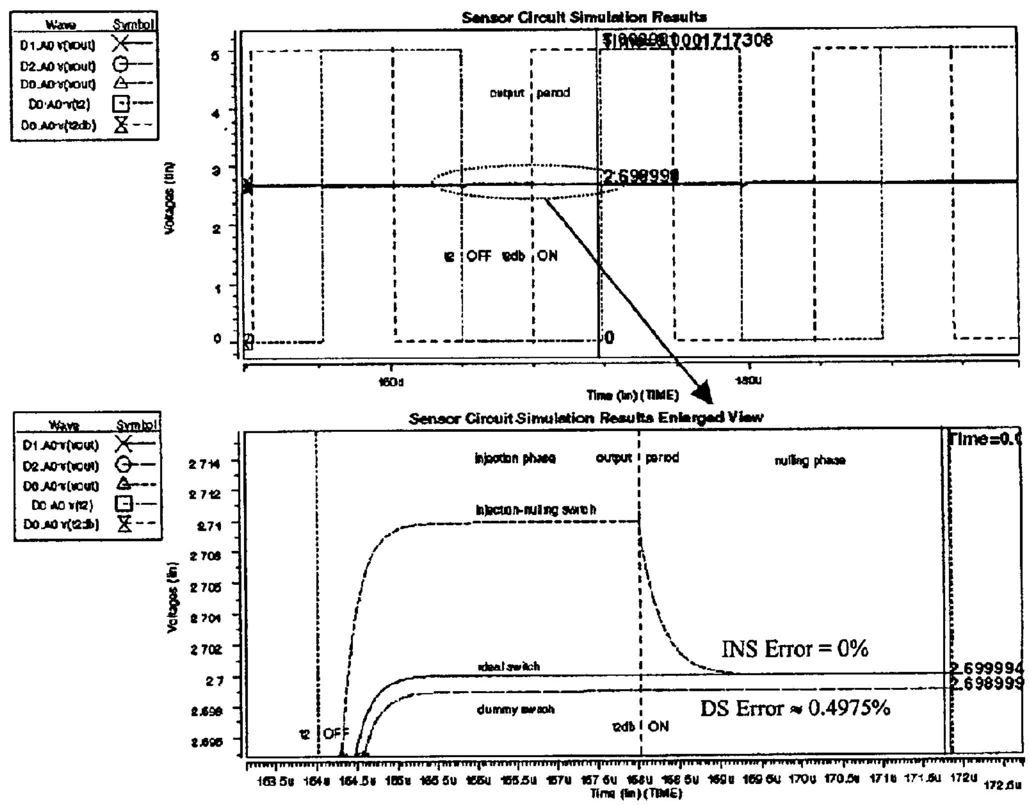
FIG. 18 illustrates simulation results of accelerometer sensing amplifier utilizing the capacitive-reset gain circuit of FIG. 15.

In this example, C1 is set to 585 fF, C2 is set to 715 fF, Cf is set to 650 fF, Ch is set to 1 pF, +Vin is set to 2.6V and −Vin is set to 2.4V. The ideal output voltage will be 2.7V. Similarly, three circuits having an ideal switch, a dummy switch and an injection-nulling switch replace the critical switch (SWc) between node A and node A1 are simulated. Operation of the three circuits are plotted in FIG. 18. The output voltage of the circuit using an injection-nulling switch is equal to the circuit using an ideal switch during the nulling phase.

Figure 19:
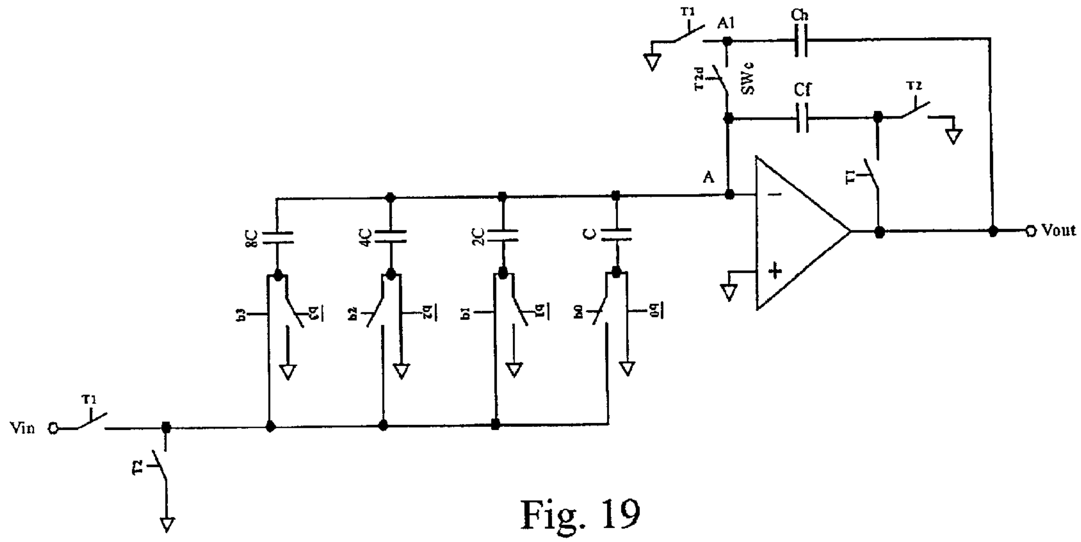
FIG. 19 shows a schematic diagram of a typical 4-bit digital-to-analog converter using a switched-capacitor technique.

FIG. 19 shows the schematic of a typical 4-bit digital-to-analog converter using a switched-capacitor technique. The binary weighted capacitor chain is connected between the input reference signal and the capacitive-reset gain circuit amplifier. A selection of the 4-bit binary code will generate an analog output voltage related to the following equation.

$$Vout = -[(8*b3) + (4*b2) + (2*b1) + b0]\left(\frac{C}{Cf}\right) Vin \tag{4}$$

where b0, b1, b2, b3 are either 0 or 1.

Figure 20:
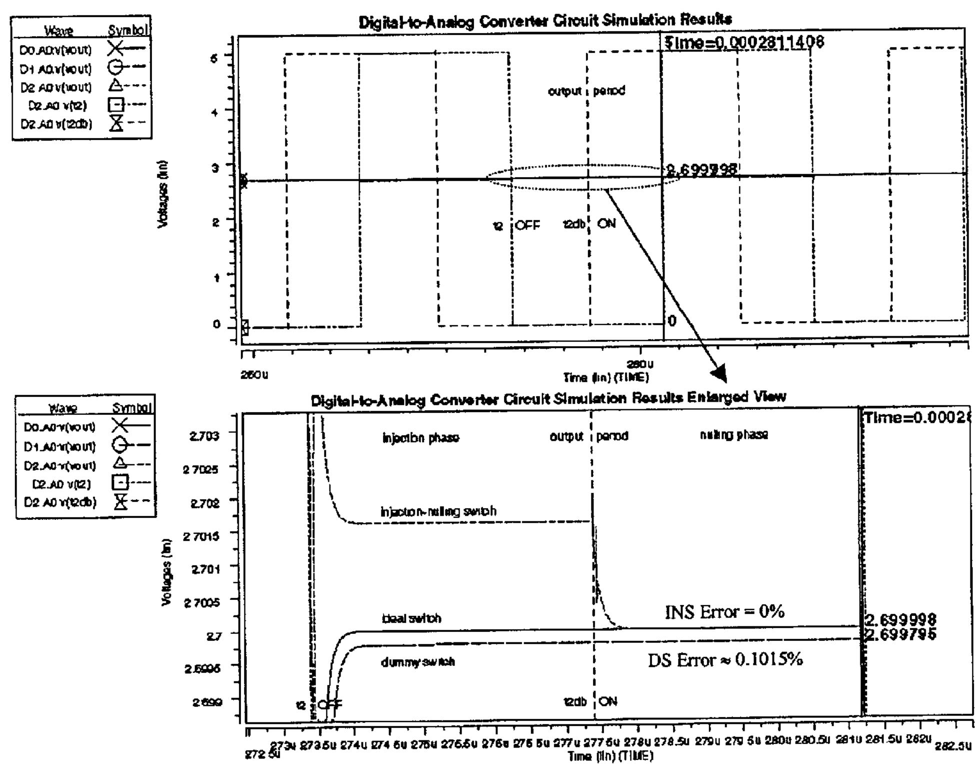
FIG. 20 shows the simulation results of a typical 4-bit digital-to-analog converter using a switched-capacitor technique.

To simulate the circuit, Cf is set to 4 pF, C is set to 250 fF, Vin is set to 2.18V and the binary code [b3b2b1b0]=[1010]. The ideal output voltage will be 2.7V. The critical switch (SWc) between node A and node A1 is replaced by an ideal switch, a dummy switch and an injection-nulling switch to obtain the simulation results in FIG. 20. The redundant charges injected into high impedance node A are nulled by the injection-nulling switch in the nulling phase, causing the output voltage to be equal to the circuit using the ideal switch.

Figure 21:
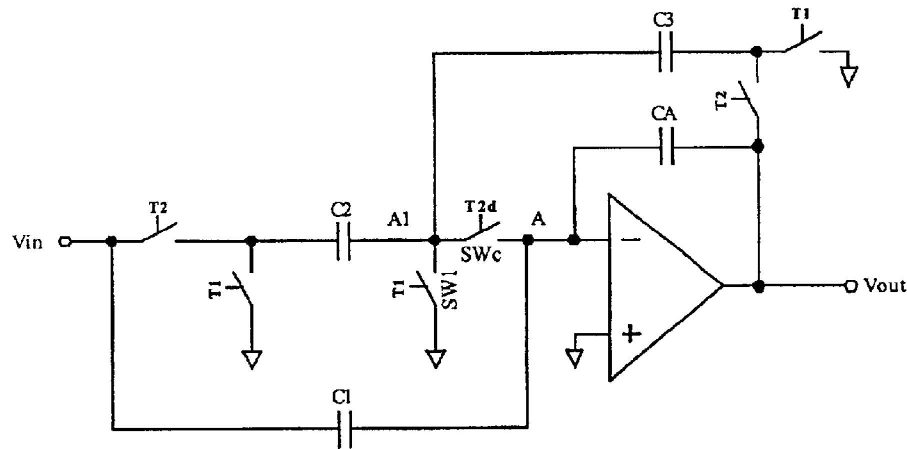
FIG. 21 shows a schematic diagram of a switch sharing low-pass filter circuit.

The injection-nulling switch can also be applied to a switched-capacitor filter. FIG. 21 illustrates a switch sharing first-order switched-capacitor low-pass filter. The switches SW1 and SWc are shared between C2 and C3. The discrete-time transfer function of the low-pass filter is given as $$H(z)=\frac{Vout(z)}{Vin(z)}=-\frac{\left(\frac{C1+C2}{CA}\right)z+\frac{C1}{CA}}{\left(1+\frac{C3}{CA}\right)z-1} \quad (5)$$

Figure 22:
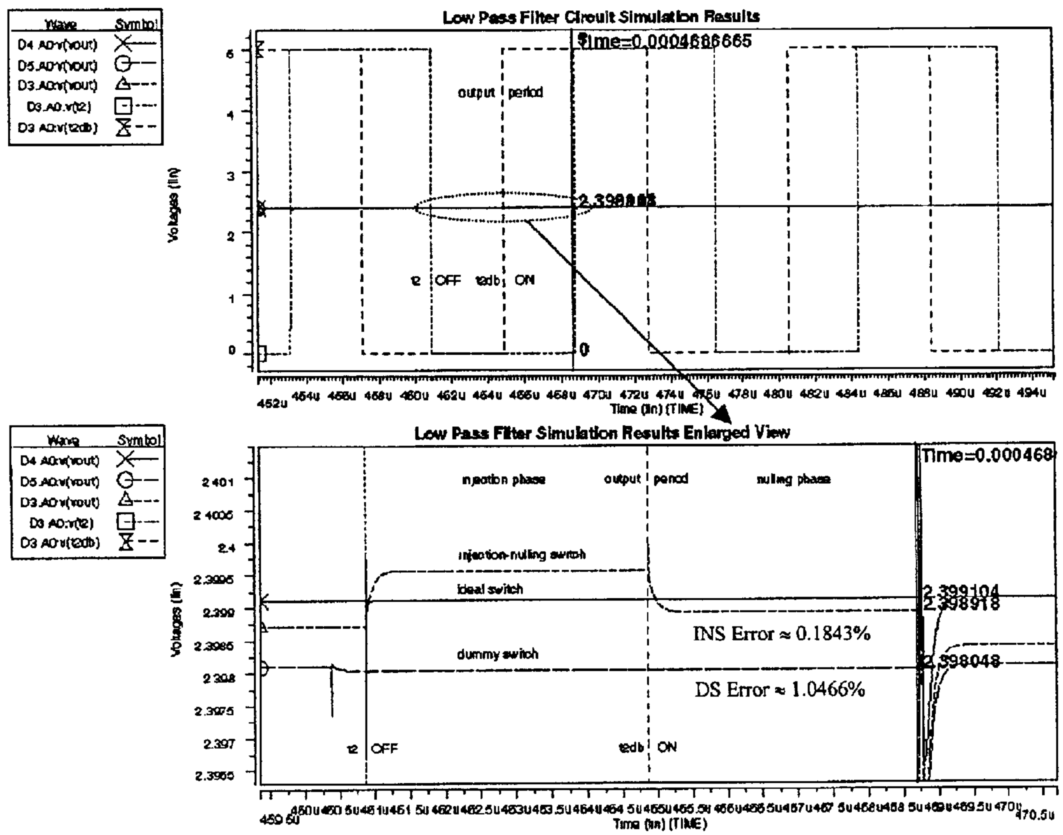
FIG. 22 shows simulation results of a switch sharing low-pass filter circuit.

In order to compare the compensation effectiveness of the switches, the output signal should be at a stable voltage. Hence, the input signal is chosen to be a direct-current (DC) voltage of 2.4V. The capacitors are chosen to have values of 10 pF. The critical switch (SWc) between node A and node A1 is replaced by an ideal switch, a dummy switch and an injection-nulling switch for simulation with node A as high impedance node. Simulation results from operation of the circuit are shown in FIG. 22. From the diagram, it can be computed that the error caused by the injection-nulling switch is about 0.1843% (taking the ideal switch result as reference), while the error caused by the dummy switch is around 1.0466%. Hence, the injection-nulling switch still has an approximate of 5.7 times of improvement over that of the dummy switch.

What is claimed is:

1. A circuit comprising:

a first switching element coupled to a first node and a second node;

a second switching element coupled to the first node;

a third switching element coupled to the second node;

a first capacitor coupled between the second switching element and a ground or reference voltage; and a second capacitor coupled between the third switching element and the ground or reference voltage.

2. The circuit of claim 1, further comprising:

a first clock signal to switch the first switching element between high and low; and a second clock signal to switch the second and third switching elements between high and low.

3. The circuit of claim 2, wherein the second clock signal is the phase-shifted complementary signal of the first clock signal.

4. A method of nulling a charge, comprising:

switching a first switching element to off by turning a first clock signal to low, causing a charge injection charges and a clock feed-through charges to flow into a first node and a second node; and switching a second switching element and a third switching element to on by turning a second clock signal to high, nulling the charge injection charges and clock feed-through charges as a result of absorbing the charge injection charges into a first capacitor and a second capacitor and generating a compensation signal with opposite polarities respectively.

* * * * *